(12) United States Patent
Denta (10) Patent No.: US 9,905,490 B2
(45) Date of Patent: Feb. 27, 2018

(54) SEMICONDUCTOR DEVICE

(71) Applicant: FUJI ELECTRIC CO., LTD., Kanagawa (JP)

(72) Inventor: Toshio Denta, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/336,799

(22) Filed: Oct. 28, 2016

(65) Prior Publication Data

US 2017/0186657 A1   Jun. 29, 2017

(30) Foreign Application Priority Data

Dec. 25, 2015 (JP) .................................. 2015-254884

(51) Int. Cl.
| | |
|---|---|
| H01L 23/495 | (2006.01) |
| H01L 23/10 | (2006.01) |
| H01L 23/053 | (2006.01) |
| H01L 23/13 | (2006.01) |
| H01L 23/373 | (2006.01) |
| H01L 23/367 | (2006.01) |

(52) U.S. Cl.
CPC ............ *H01L 23/10* (2013.01); *H01L 23/053* (2013.01); *H01L 23/13* (2013.01); *H01L 23/3735* (2013.01); *H01L 23/367* (2013.01); *H01L 2924/13055* (2013.01); *H01L 2924/15162* (2013.01)

(58) Field of Classification Search
CPC ......... H01L 23/4006; H01L 2924/1815; H01L 23/10
See application file for complete search history.

(56) References Cited

U.S. PATENT DOCUMENTS

2014/0209953 A1* 7/2014 Kamada .................. H01L 24/32
257/98
2014/0374889 A1   12/2014 Denta et al.

FOREIGN PATENT DOCUMENTS

| JP | H03-124676 U | 12/1991 |
|---|---|---|
| JP | H05-226793 A | 9/1993 |
| JP | H11-26893 A | 1/1999 |
| JP | 2000-133769 A | 5/2000 |
| JP | 2004-006905 A | 1/2004 |

* cited by examiner

*Primary Examiner* — Samuel Gebremariam (57) ABSTRACT

Provided is a semiconductor device including an insulating substrate on which a semiconductor chip is mounted and a case that is adhered to the insulating substrate. The case includes a recess portion that is provided with an adhesive agent and into which a front surface side of the insulating substrate is inserted. The insulating substrate includes, in a side surface along a thickness direction, a front-side notched portion formed on the front surface side and a back-side notched portion formed on a back surface side. Length from a peak located between the front-side notched portion and the back-side notched portion to the front surface in the thickness direction is greater than or equal to 30% of an less than or equal to 70% of length of the recess portion of the case in the thickness direction.

13 Claims, 9 Drawing Sheets

SEMICONDUCTOR DEVICE

The contents of the following Japanese patent application are incorporated herein by reference:
NO. 2015-254884 filed in JP on Dec. 25, 2015.

BACKGROUND

1. Technical Field

The present invention relates to a semiconductor device.

2. Related Art

A conventional semiconductor device is known in which an insulating substrate having a semiconductor chip or the like mounted thereon is incorporated in a case formed of resin or the like, as shown in Patent Documents 1 to 3, for example. The insulating substrate is attached by engaging with holes formed in a back surface of the case.

Patent Document 1: Japanese Patent Application Publication No. 2013-258321
Patent Document 2: Japanese Patent Application Publication No. 2004-6905
Patent Document 3: Japanese Patent Application Publication No. 2000-133769

In a semiconductor device, the attachment between insulating substrate and the case preferably has high reliability.

SUMMARY

According to a first aspect of the present invention, provided is a semiconductor device comprising an insulating substrate on which a semiconductor chip is mounted and a case that is adhered to the insulating substrate. The case may include a recess portion that is provided with an adhesive agent and into which a front surface side of the insulating substrate is inserted. The insulating substrate may include, in a side surface along a thickness direction, a front-side notched portion formed on the front surface side and a back-side notched portion formed on a back surface side. Length from a peak located between the front-side notched portion and the back-side notched portion to the front surface in the thickness direction may be greater than or equal to 30% and less than or equal to 70% of length of the recess portion of the case in the thickness direction.

The front-side notched portion may be shorter than the back-side notched portion in the thickness direction. An angle of the front-side notched portion relative to the thickness direction may be the same as an angle of the back-side notched portion relative to the thickness direction. An angle of the front-side notched portion relative to the thickness direction may be less than an angle of the back-side notched portion relative to the thickness direction.

The angle of the front-side notched portion relative to the thickness direction may be greater than or equal to 15 degrees and less than or equal to 30 degrees. The angle of the back-side notched portion relative to the thickness direction may be greater than or equal to 20 degrees and less than or equal to 50 degrees.

An end of the front-side notched portion on the front surface side may be provided farther outward on the insulating substrate than an end of the back-side notched portion on the back surface side. Width of the front-side notched portion in the front surface may be less than or equal to half of width of the back-side notched portion in the back surface.

The semiconductor device described above may further comprise a conductive pattern that is provided on the front surface of the insulating substrate. Width of the front-side notched portion in the front surface may be less than a distance between an end of the front-side notched portion on the front surface and the conductive pattern. The width of the front-side notched portion in the front surface may be less than or equal to 10% of the distance between the end of the front-side notched portion on the front surface and the conductive pattern.

A side wall of the recess portion opposite the side surface of the insulating substrate may be inclined relative to the thickness direction toward the same side as the front-side notched portion. The side wall of the recess portion may be substantially parallel to the front-side notched portion.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
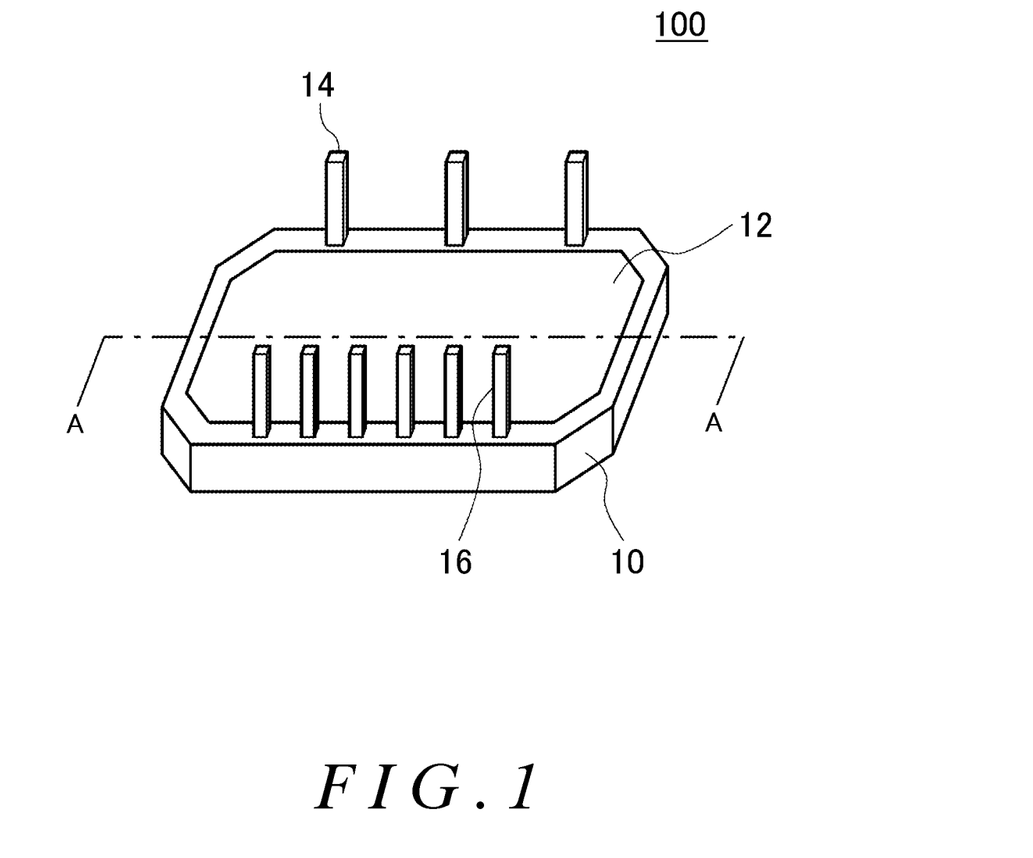
FIG. 1 is a perspective view showing the outline of a semiconductor device 100 according to an embodiment of the present invention.

FIG. 1 is a perspective view showing the outline of a semiconductor device 100 according to an embodiment of the present invention. The semiconductor device 100 includes a case 10 and a lid 12. The case 10 houses therein an electronic component such as a semiconductor chip. The case 10 may have a frame structure formed of resin or the like. A space surrounded by the case 10 is filled with a sealing agent such as gel. The lid 12 is provided covering the top of the space surrounded by the case 10. The lid 12 may be secured to the case 10 by an adhesive agent.

A plurality of main terminals 14 and a plurality of sub terminals 16 that are connected to the electronic component housed in the case 10 are formed on the top surface of the case 10. The electronic component includes a power device such as an IGBT (Insulated Gate Bipolar Transistor). Each main terminal 14 is connected to a terminal through which a large current flows, such as an emitter terminal or a collector terminal of the IGBT, for example. Each sub terminal 16 is connected to a control terminal through which a large current does not flow, such as a gate terminal of the IGBT, for example.

Figure 2:
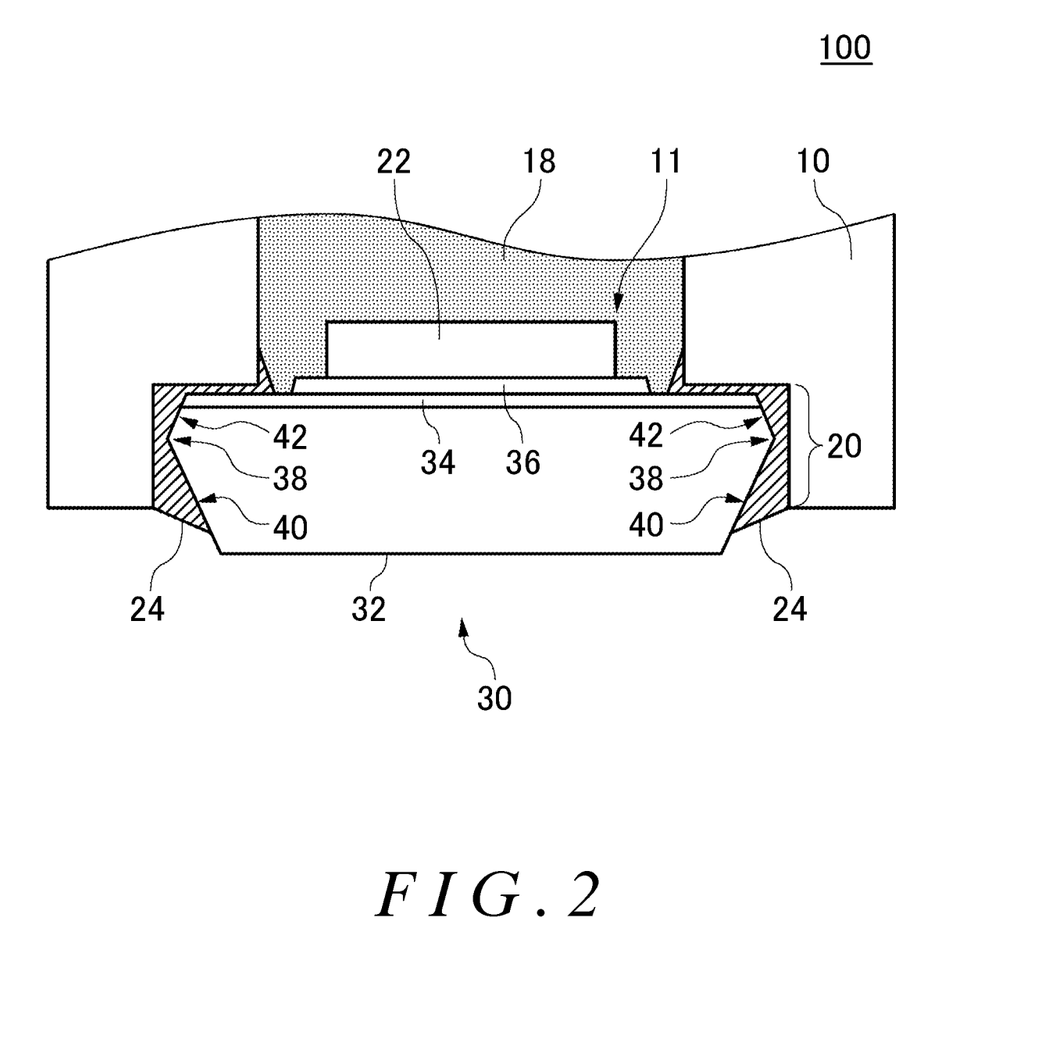
FIG. 2 shows an example of the A-A cross section shown in FIG. 1.

FIG. 2 shows an example of the A-A cross section shown in FIG. 1. In FIG. 2, each member is shown schematically, and the scale of each member in FIG. 2 does not match the scale of each member shown in FIG. 1. Furthermore, FIG. 2 shows a cross section near the back surface of the semiconductor device 100, and the lid 12, the main terminals 14, and the sub terminals 16 are omitted from this view.

The semiconductor device 100 further includes an insulating substrate 30 attached to the case 10. A front surface side of the insulating substrate 30 is inserted into a recess portion 20 provided on the back surface of the case 10. In this Specification, the surface of the semiconductor device 100 on the lid 12 side is referred to as the front surface, and the surface of the semiconductor device 100 on the insulating substrate 30 side is referred to as the back surface. For each member such as the insulating substrate 30 as well, the surface on the lid 12 side is referred to as the front surface and the surface on the opposite side is referred to as the back surface.

The recess portion 20 is formed continuously with an internal space 11 of the case 10. The recess portion 20 exposes at least a portion of the front surface of the insulating substrate 30 inserted therein to the internal space 11. The electronic component such as the semiconductor chip 22 is mounted on the front surface of the insulating substrate 30 exposed to the internal space 11. The internal space 11 of the case 10 is sealed by a sealing agent 18 such as gel.

The insulating substrate 30 includes a metal plate 32 and an insulating layer 34 provided covering the front surface of the metal plate 32. The metal plate 32 is formed of metal, such as aluminum or copper. The metal plate 32 releases the heat generated from the semiconductor chip 22 or the like housed in the case 10. The insulating layer 34 is formed of an organic insulating material containing a conductive filler or a ceramic such as alumina, and insulates the front surface of the metal plate 32.

A conductive pattern 36 is formed on the front surface of the insulating layer 34. The conductive pattern 36 is formed of metal such as copper, and has a prescribed wiring pattern. The electronic component such as the semiconductor chip 22 is mounted on the front surface of the conductive pattern 36. The conductive pattern 36 and the electronic component may include terminals connecting to the main terminals 14 and the sub terminals 16 shown in FIG. 1.

The insulating substrate 30 inserted into the recess portion 20 is adhered to the case 10 by an adhesive agent 24. The adhesive agent 24 in this example is provided in the recess portion 20 in advance before the insertion of the insulating substrate 30, and is then cured by heating or the like after the insulating substrate 30 has been inserted into the recess portion 20.

The insulating substrate 30 has a side surface along a thickness direction thereof. This side surface is a surface between the front surface and the back surface in the insulating substrate 30. A front-side notched portion 42 formed on the front surface side of the insulating substrate 30 and a back-side notched portion 40 formed on the back surface side of the insulating substrate 30 are provided in the side surface of the insulating substrate 30.

The front-side notched portion 42 is shaped as a notch in a prescribed range from the front surface in the side surface of the insulating substrate 30. The side surface of the insulating substrate 30 in the front-side notched portion 42 is formed to be inclined relative to the thickness direction of the insulating substrate 30. This inclined surface is provided such that the notch is formed farther inward in the insulating substrate 30 at positions closer to the front surface of the insulating substrate 30. The front-side notched portion 42 of this example is formed across the entire insulating layer 34 and a partial region on the front surface side of the metal plate 32.

The back-side notched portion 40 is shaped as a notch in a prescribed range from the back surface in the side surface of the insulating substrate 30. The side surface of the insulating substrate 30 in the back-side notched portion 40 is formed to be inclined relative to the thickness direction of the insulating substrate 30. This inclined surface is provided such that the notch is formed farther inward in the insulating substrate 30 at positions closer to the back surface of the insulating substrate 30.

A peak 38 is formed between the front-side notched portion 42 and the back-side notched portion 40 on the side surface of the insulating substrate 30. The peak 38 refers to a point that protrudes farthest outward on the side surface, for example. Furthermore, the peak 38 may refer to a point where the front-side notched portion 42 and the back-side notched portion 40 intersect.

The front-side notched portion 42 is provided such that the end thereof on the front surface of the insulating substrate 30 is farther inward in the insulating substrate 30 than the peak 38. Similarly, the back-side notched portion 40 is provided such that an end thereof in the back surface of the insulating substrate 30 is farther inward in the insulating substrate 30 than the peak 38.

By including the back-side notched portion 40 in the insulating substrate 30, it is possible to widen the space between the insulating substrate 30 and the case 10 in the region below the peak 38. Furthermore, by including the front-side notched portion 42 in the insulating substrate 30, it is possible to widen the space between the insulating substrate 30 and the case 10 in the region above the peak 38.

Therefore, a large amount of the adhesive agent 24 can be provided between the insulating substrate 30 and the case 10, and the reliability of the adhesion between the insulating substrate 30 and the case 10 can be improved. In other words, the adhesive surface area between the insulating substrate 30 and the case 10 is increased, and therefore cracking in the adhesive agent 24 can be restricted even when thermal stress is repeatedly applied. In particular, it is possible to improve the endurance to thermal contraction stress in the thickness direction of the insulating substrate 30. The adhesive agent 24 is formed above and below the peak 38 and can support the insulating substrate 30, and therefore it is possible to restrict the insulating substrate 30 from falling out from the recess portion 20.

First Embodiment Example

Figure 3:
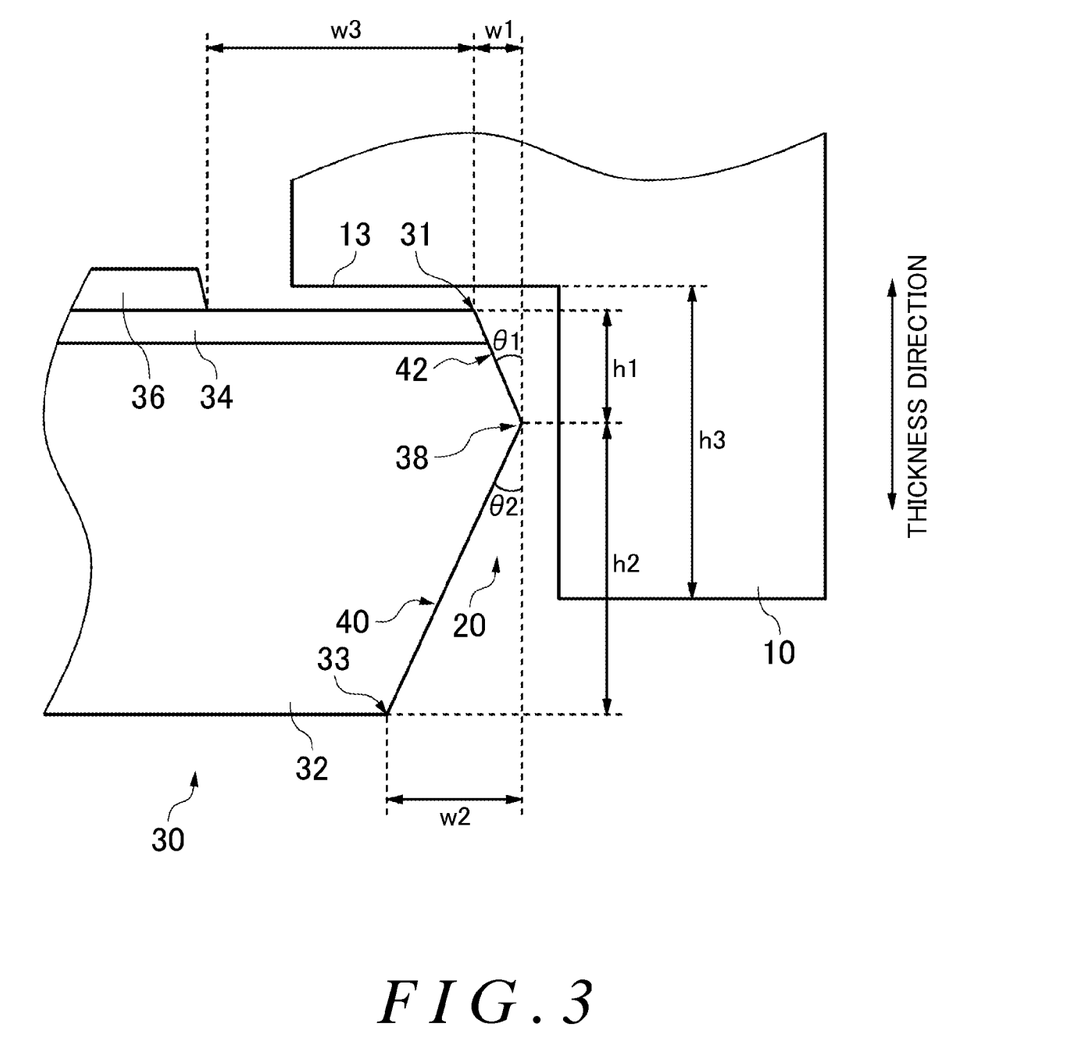
FIG. 3 is an enlarged view of a region near the side surface of the insulating substrate 30 in a cross section of the semiconductor device 100 according to the first embodiment.

FIG. 3 is an enlarged view of a region near the side surface of the insulating substrate 30 in a cross section of the semiconductor device 100 according to the first embodiment example. In FIG. 3, the adhesive agent 24 and the sealing agent 18 are omitted. In this example, the direction connecting the front surface and the back surface of the insulating substrate 30 over the shortest distance is referred to as the thickness direction.

In the thickness direction, the length between the peak 38 and the front surface of the insulating substrate 30 is h1, the length between the peak 38 and the back surface of the insulating substrate 30 is h2, and the length of the recess portion 20 is h3. The recess portion 20 has an opposing surface 13 that faces the front surface of the insulating substrate 30. The length of the recess portion 20 may refer to the length from the back surface of the case 10 to the opposing surface 13. Here, h1 is preferably greater than or equal to 30% of h3 and less than or equal to 70% of h3. Furthermore, h1 may be greater than or equal to 40% of h3 and less than or equal to 60% of h3.

The thickness of the adhesive agent 24 between the case 10 and the front surface of the insulating substrate 30 is sufficiently small compared to h1 and h3. Therefore, if h1 is greater than or equal to 30% of h3 and less than or equal to 70% of h3, the peak 38 is positioned near a central portion of the recess portion 20 in the thickness direction. With this structure, a sufficient amount of the adhesive agent 24 can be disposed both above and below the peak 38.

Furthermore, in the thickness direction, the front-side notched portion 42 may be shorter than the back-side notched portion 40. In the example of FIG. 3, the length of the front-side notched portion 42 is equal to h1 and the length of the back-side notched portion 40 is equal to h2. Therefore, it is possible to arrange the peak 38 near the center of the recess portion 20 while having the back surface side of the insulating substrate 30 protrude from the case 10. By having the back surface side of the insulating substrate 30 protrude, the back surface of the insulating substrate 30 can be made to easily contact a heat sink or the like.

At least half of the back-side notched portion 40 is preferably inserted into the recess portion 20. In other words, it is preferable that h3−h1≥h2/2. In this way, it is possible to ensure the space between the back-side notched portion 40 and the recess portion 20.

If the front-side notched portion 42 is shorter than the back-side notched portion 40 in the thickness direction, the angle θ1 of the front-side notched portion 42 relative to the thickness direction may be the same as the angle θ2 of the back-side notched portion 40 relative to the thickness direction. In this way, the width w1 of the front-side notched portion 42 in the front surface of the insulating substrate 30 can be made smaller than the width w2 of the back-side notched portion 40 in the back surface of the insulating substrate 30. Therefore, it is possible to increase a surface distance w3 between the end of the front-side notched portion 42 and the end of the conductive pattern 36 on the front surface of the insulating substrate 30, while improving the reliability of the adhesion of the insulating substrate 30. Accordingly, withstand voltage between the conductive pattern 36 and the metal plate 32 can be increased.

The angle θ1 of the front-side notched portion 42 relative to the thickness direction may be less than the angle θ2 of the back-side notched portion 40 relative to the thickness direction. In this case, the width w1 of the front-side notched portion 42 can also be made even less than the width w2 of the back-side notched portion 40 and the surface distance w3 can be made even greater.

More specifically, the angle θ1 of the front-side notched portion 42 relative to the thickness direction may be greater than or equal to 15 degrees and less than or equal to 30 degrees. The angle θ2 of the back-side notched portion 40 relative to the thickness direction may be greater than or equal to 20 degrees and less than or equal to 50 degrees. It should be noted that, as described above, θ1 is preferably less than or equal to θ2.

The end 31 of the front-side notched portion 42 at the front surface is provided farther outward in the insulating substrate 30 than the end 33 of the back-side notched portion 40 on the back surface. Being farther outward on the insulating substrate 30 refers to being a greater distance from the center of the insulating substrate 30 in a plane perpendicular to the thickness direction of the insulating substrate 30.

The width w1 of the front-side notched portion 42 in the front surface of the insulating substrate 30 may be less than or equal to half of the width w2 of the back-side notched portion 40 in the back surface of the insulating substrate 30. In this way, it is possible to increase the surface distance w3 while improving the reliability of the adhesion between the insulating substrate 30 and the case 10.

The width w1 of the front-side notched portion 42 in the front surface is sufficiently less than the surface width w3 between the end 31 of the front-side notched portion 42 on the front surface of the insulating substrate 30 and the conductive pattern 36. In this way, reduction of the surface distance w3 caused by the front-side notched portion 42 being provided can be restricted. For example, the width w1 of the front-side notched portion is preferably less than or equal to 10% of the surface distance w3 described above.

Figure 4:
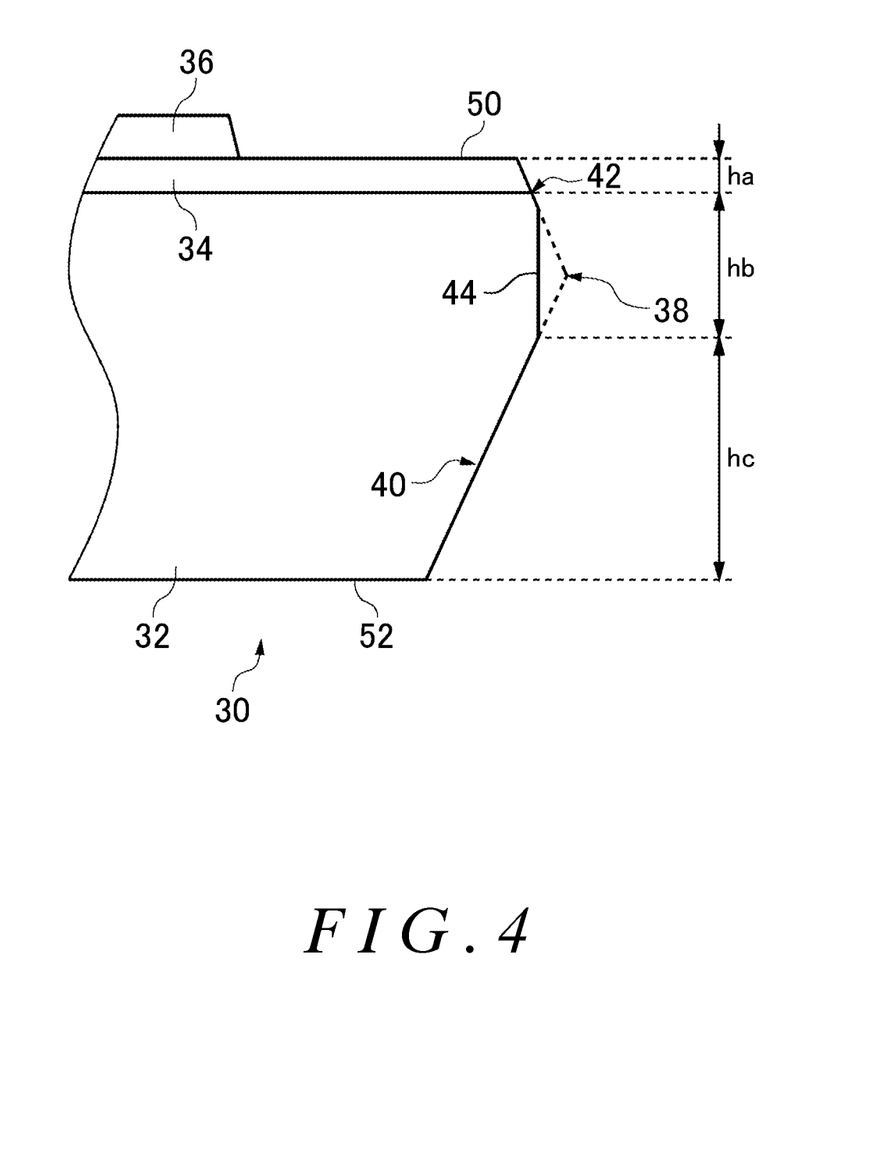
FIG. 4 is an enlarged view of a region near the side surface of the insulating substrate 30.

FIG. 4 is an enlarged view of a region near the side surface of the insulating substrate 30. The insulating substrate 30 in this example has an intermediate portion 44 between the front-side notched portion 42 and the back-side notched portion 40 on the side surface. The intermediate portion 44 has an angle relative to the thickness direction of the insulating substrate 30 that differs from both the angle of the front-side notched portion 42 and the angle of the back-side notched portion 40. At least a portion of the intermediate portion 44 is substantially parallel to the thickness direction of the insulating substrate 30.

In this case, the peak 38 on the side surface of the insulating substrate 30 refers to the point where the plane obtained by extending the front-side notched portion 42 intersects with the plane obtained by extending the back-side notched portion 40. The side surface of the insulating substrate 30 in each notched portion has a planar shape, but there may be cases where the side surface of the insulating substrate 30 does not have a planar shape at the end of each notched portion, due to the machining accuracy of the notched portions. In such a case, the slope obtained by extending the plane of the front-side notched portion 42 may considered as being the slope of a first linear portion that is initially detected when the front-side notched portion 42 is seen from the front surface 50 of the insulating substrate 30. Similarly, the slope obtained by extending the plane of the back-side notched portion 40 may considered as being the slope of a second linear portion that is initially detected when the back-side notched portion 40 is seen from the back surface 52 of the insulating substrate 30. The peak 38 may be the intersection point of the first linear portion and the second linear portion.

In this example, in the thickness direction of the insulating substrate 30, the length of the front-side notched portion 42 is ha, the length of the intermediate portion 44 is hb, and the length of the back-side notched portion 40 is hc. Here, hc may be greater than ha. Furthermore, hc may be greater than the sum of ha and hb. Yet further, ha may be equal to hb.

As an example, the thickness of the insulating substrate 30 is greater than or equal to 1 mm and less than or equal to 2.2 mm. The thickness of the insulating layer 34 is greater than or equal to 80 μm and less than or equal to 160 μm. Furthermore, hc is greater than or equal to 0.6 mm and less than or equal to 1.4 mm, and ha and hb are each greater than or equal to 0.2 mm and less than or equal to 0.4 mm.

Second Embodiment Example

Figure 5:
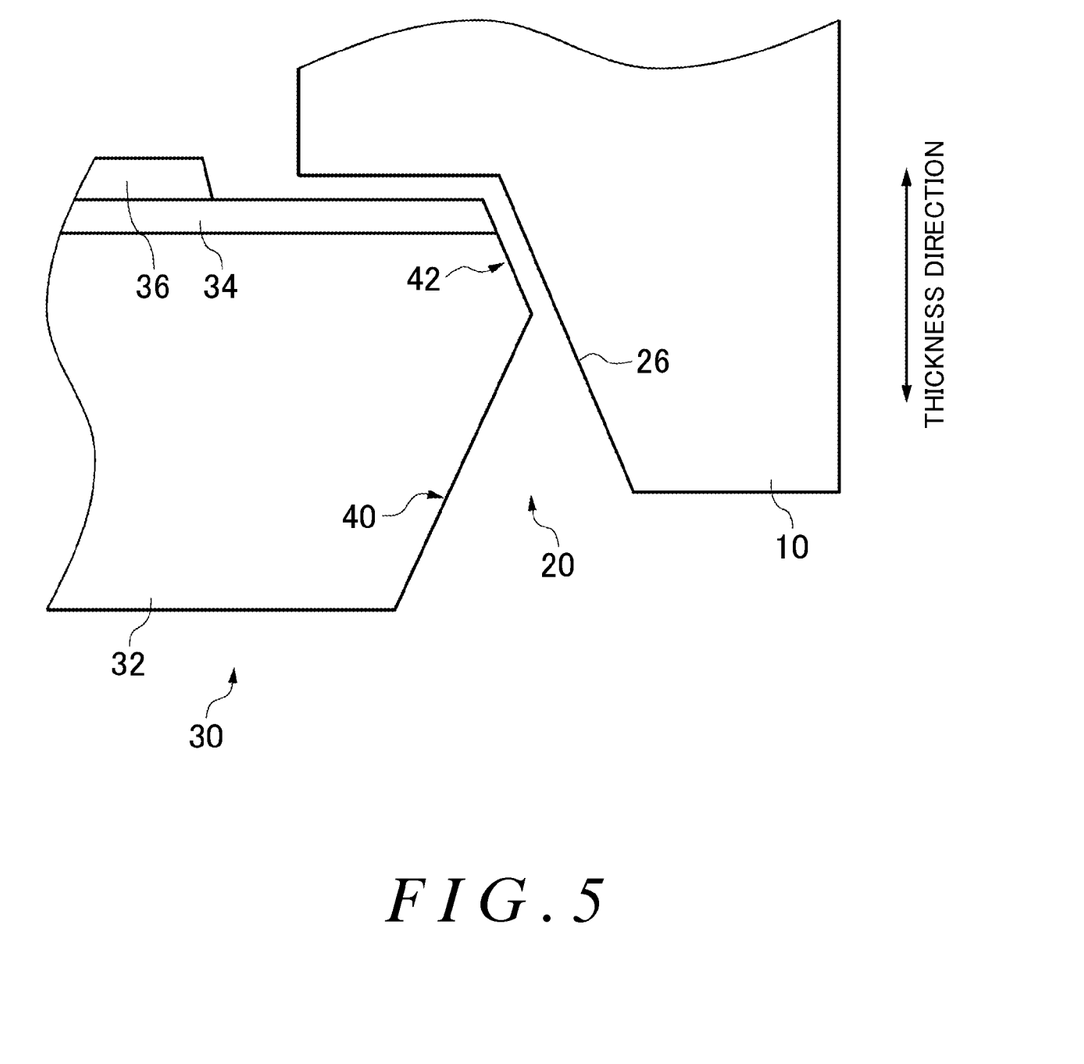
FIG. 5 is an enlarged view of a region near the side surface of the insulating substrate 30 in a cross section of a semiconductor device 100 according to a second embodiment example.

FIG. 5 is an enlarged view of a region near the side surface of the insulating substrate 30 in a cross section of a semiconductor device 100 according to a second embodiment example. In the first embodiment example, the side wall opposite the side surface of the insulating substrate 30 in the recess portion 20 of the case 10 is provided parallel to the thickness direction of the insulating substrate 30. In the second embodiment example, the side wall 26 of the recess portion 20 is inclined relative to the thickness direction of the insulating substrate 30 toward the same side as the front-side notched portion 42.

In other words, the side wall 26 is inclined such that the area of the opening of the recess portion 20 becomes greater along a direction toward the back surface of the case 10. As an example, the side wall of the recess portion 20 is inclined to be substantially parallel to the front-side notched portion 42. Here, being substantially parallel means that the difference between the slopes is in a range of ±10 degrees.

With this configuration, the insulating substrate 30 can be easily inserted at a prescribed position in the recess portion 20. Furthermore, since a large amount of the adhesive agent 24 can be arranged in the region opposite the back-side notched portion 40, the reliability of the adhesion can be improved.

Figure 6:
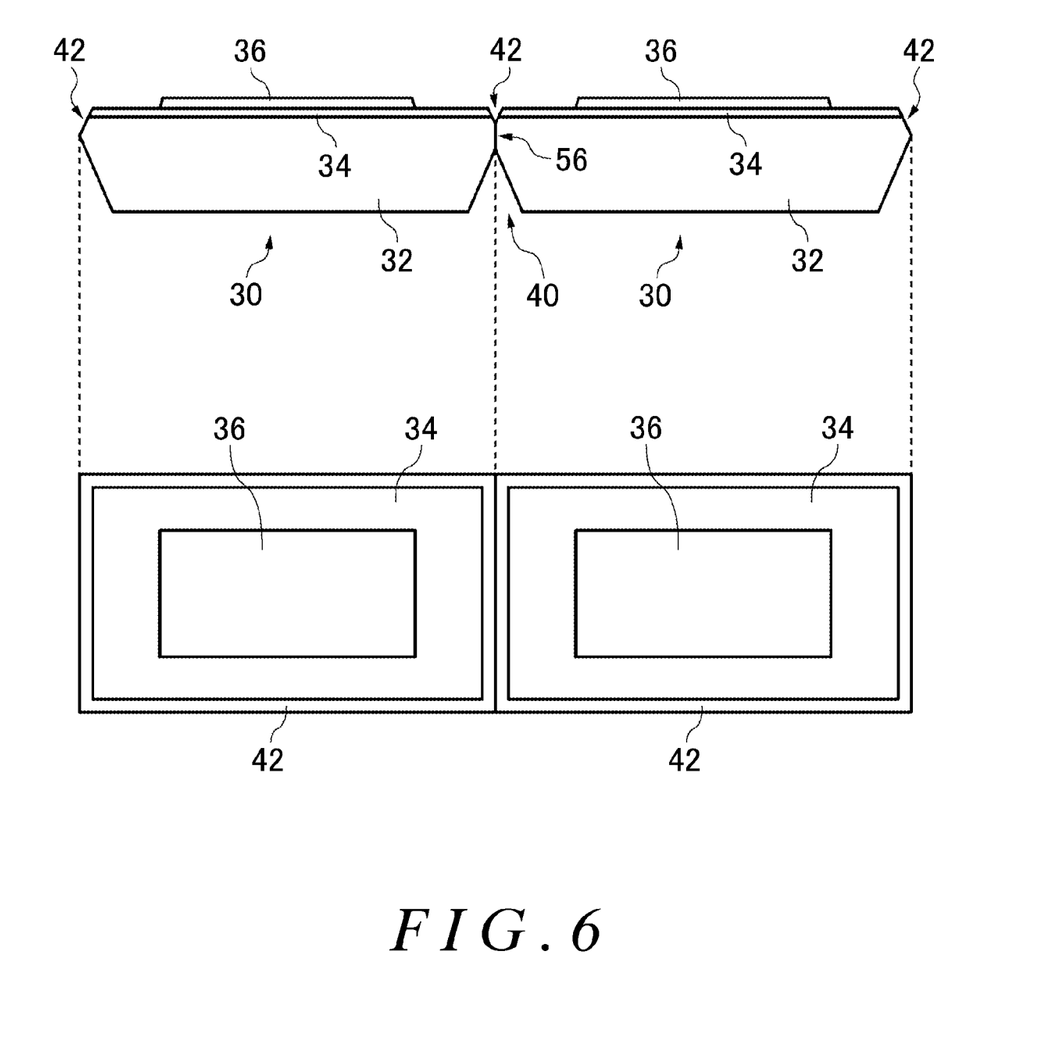
FIG. 6 shows an exemplary machining method of the insulating substrate 30.

FIG. 6 shows an exemplary machining method of the insulating substrate 30. The upper portion of FIG. 6 shows a cross section of the insulating substrate 30, and the lower portion of FIG. 6 shows the front surface of the insulating substrate 30. First, a base substrate having a surface area equal to that of a plurality of insulating substrates 30 is prepared. FIG. 6 shows only two insulating substrates 30, but a greater number of insulating substrates 30 may be manufactured from one base substrate.

The base substrate includes a metal plate and an insulating layer. A conductive pattern 36 is formed at a prescribed position on the base substrate. Furthermore, the front-side notched portion 42 is formed in the front surface of the base substrate and the back-side notched portion 40 is formed in the back surface of the base substrate, in a manner to surround the region corresponding to each insulating substrate 30.

At this time, a residual portion 56 is provided between the front-side notched portion 42 and the back-side notched portion 40, such that the front-side notched portion 42 and the back-side notched portion 40 do not penetrate through the base substrate. The residual portion 56 corresponds to the intermediate portion 44 shown in FIG. 4. A plurality of insulating substrates 30 are then manufactured by dividing the base substrate along the front-side notched portion 42 and the back-side notched portion 40.

Figure 7:
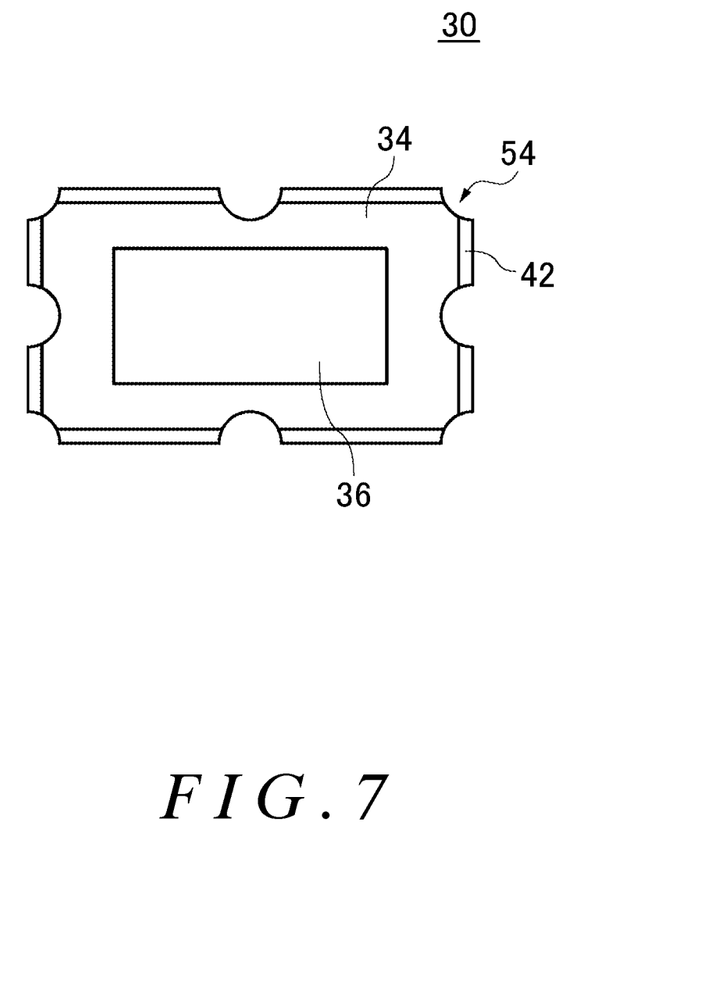
FIG. 7 shows another example of the front surface of the insulating substrate 30.

FIG. 7 shows another example of the front surface of the insulating substrate 30. The insulating substrate 30 in this example has a rectangular shape. It should be noted that the insulating substrate 30 has a plurality of penetrating portions 54 at the edge of the rectangular shape. Each penetrating portion 54 is a notch that passes through the edge of the insulating substrate 30 from the front surface to the back surface.

By providing the penetrating portions 54, when inserting the insulating substrate 30 into the recess portion 20 of the case 10, the adhesive agent 24 arranged in advance within the recess portion 20 can easily move into the region opposite the back-side notched portion 40. In this way, the adhesion reliability between the insulating substrate 30 and the case 10 can be further improved.

First Comparative Example

Figure 8:
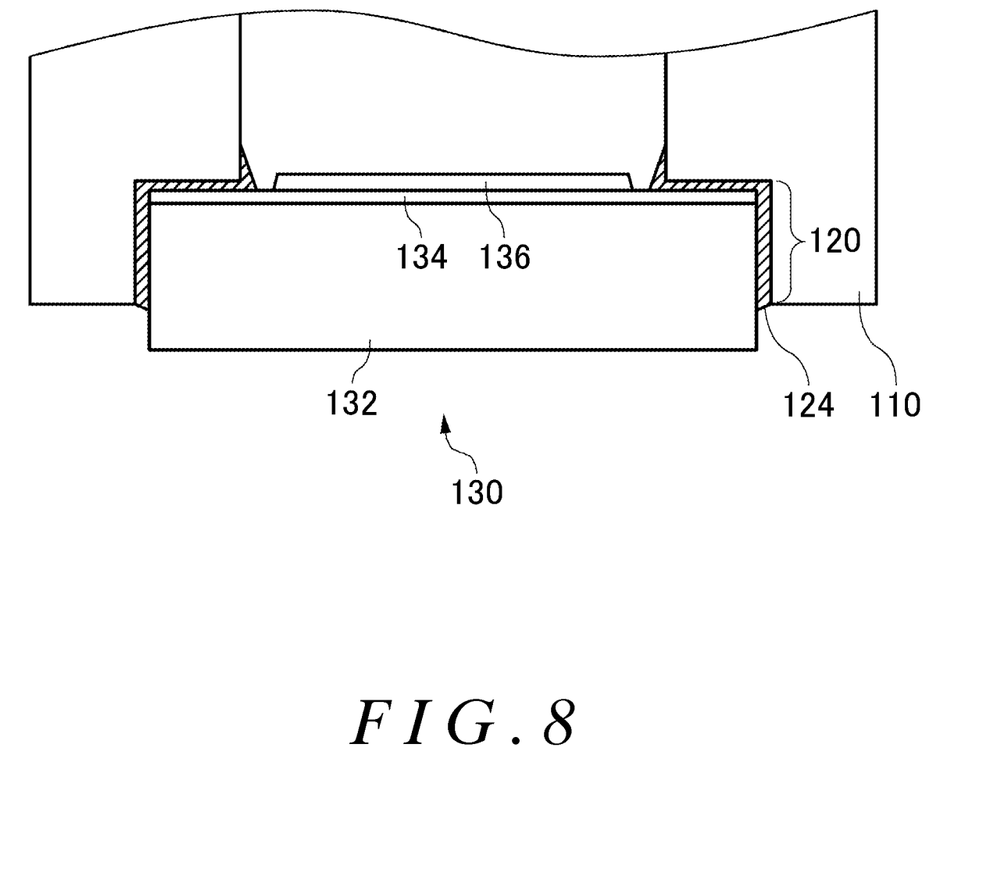
FIG. 8 shows a first comparative example.

FIG. 8 shows a first comparative example. The first comparative example includes a case 110 and an insulating substrate 130. A recess portion 120 is provided on the back surface of the case 110. An adhesive agent 124 is provided within the recess portion 120.

The insulating substrate 130 includes a metal plate 132 and an insulating layer 134. A conductive pattern 136 is formed on top of the insulating layer 134. The side surface of the insulating substrate 130 in this example is parallel to the thickness direction of the insulating substrate 130. Therefore, it is difficult to increase the amount of the adhesive agent 124 provided.

There is an idea for enabling an increase in the amount of the adhesive agent 124 by making the area of the opening in the recess portion 120 larger than the outer shape of the insulating substrate 130, but in such a case the positional variation of the insulating substrate 130 in the recess portion 120 is undesirably increased. Furthermore, since the side surface of the insulating substrate 130 does not have a peak, the insulating substrate 130 easily falls out of the recess portion 120.

Second Comparative Example

Figure 9:
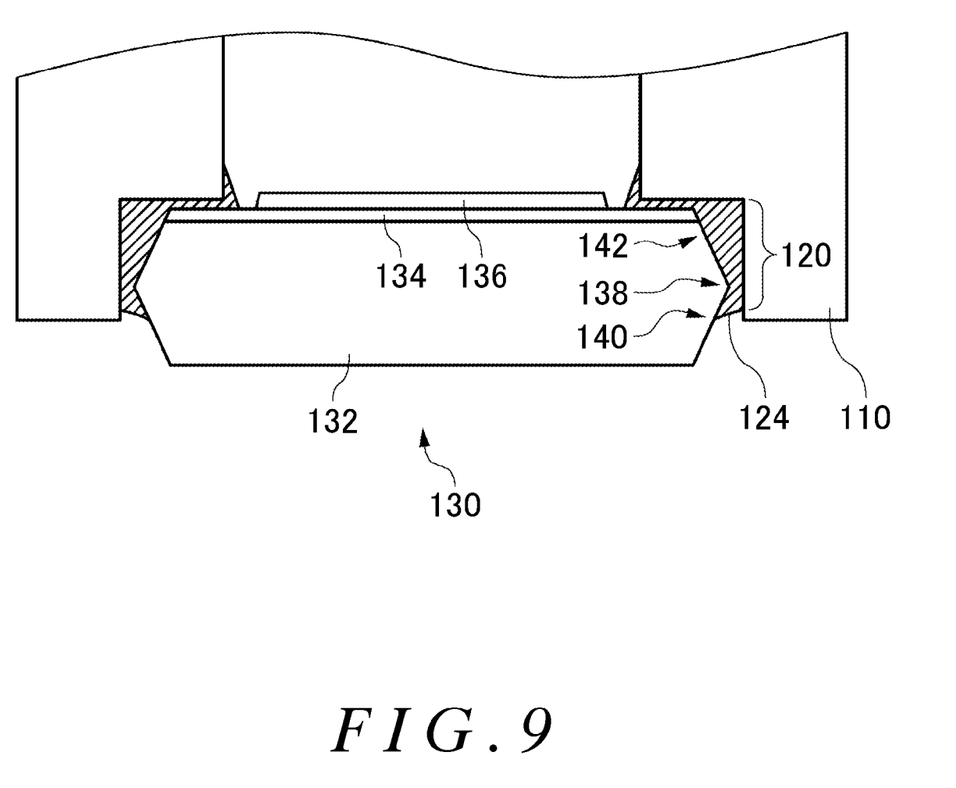
FIG. 9 shows a second comparative example.

FIG. 9 shows a second comparative example. In this example, a front-side notched portion 142, a peak 138, and a back-side notched portion 140 are included in the side surface of the insulating substrate 130. However, this peak 138 is positioned approximately at the bottom end of the recess portion 120.

In this example, most of the back-side notched portion 140 protrudes from the recess portion 120. Therefore, it is difficult to provide the adhesive agent 124 in the region opposite the back-side notched portion 140, and the reliability of the adhesion between the insulating substrate 130 and the case 110 is reduced.

Furthermore, the front-side notched portion 142 and the back-side notched portion 140 are approximately the same size. Therefore, the surface distance along the conductive pattern 136 and the metal plate 132 becomes short, and the withstand voltage becomes worse.

In contrast to these comparative examples, with the semiconductor devices 100 according to the first and second embodiment examples, it is possible to improve the reliability of the adhesion between the insulating substrate 30 and the case 10. It is also possible to restrict the decrease of the surface distance along the conductive pattern 36 and the metal plate 32.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

LIST OF REFERENCE NUMERALS

10: case, 11: internal space, 12: lid, 13: opposing surface, 14: main terminal, 16: sub terminal, 18: sealing agent, 20: recess portion, 22: semiconductor chip, 24: adhesive agent, 26: side wall, 30: insulating substrate, 31: end, 32: metal plate, 33: end, 34: insulating layer, 36: conductive pattern, 38: peak, 40: back-side notched portion, 42: front-side notched portion, 44: intermediate portion, 50: front surface, 52: back surface, 54: penetrating portion, 56: remaining portion, 100: semiconductor device, 110: case, 120: recess portion, 124: adhesive agent, 130: insulating substrate, 132: metal plate, 134: insulating layer, 136: conductive pattern, 138: peak, 140: back-side notched portion, 142: front-side notched portion

What is claimed is:

1. A semiconductor device comprising:
an insulating substrate on which a semiconductor chip is mounted; and
a case that is adhered to the insulating substrate, wherein
the case includes a recess portion that is provided with an adhesive agent and into which a front surface side of the insulating substrate is inserted, the adhesive agent provided between the insulating substrate and the case, and in direct contact with the insulating substrate and the case,
the insulating substrate includes, in a side surface along a thickness direction:
a front-side notched portion formed on the front surface side, and
a back-side notched portion formed on a back surface side, and
length from a peak located between the front-side notched portion and the back-side notched portion to the front surface in the thickness direction is greater than or equal to 30% and less than or equal to 70% of length of the recess portion of the case in the thickness direction.

2. The semiconductor device according to claim 1, wherein
the front-side notched portion is shorter than the back-side notched portion in the thickness direction.

3. The semiconductor device according to claim 2, wherein
an angle of the front-side notched portion relative to the thickness direction is the same as an angle of the back-side notched portion relative to the thickness direction.

4. The semiconductor device according to claim 1, wherein
an angle of the front-side notched portion relative to the thickness direction is less than an angle of the back-side notched portion relative to the thickness direction.

5. The semiconductor device according to claim 4, wherein
the angle of the front-side notched portion relative to the thickness direction is greater than or equal to 15 degrees and less than or equal to 30 degrees.

6. The semiconductor device according to claim 5, wherein
the angle of the back-side notched portion relative to the thickness direction is greater than or equal to 20 degrees and less than or equal to 50 degrees.

7. The semiconductor device according to claim 1, wherein
an end of the front-side notched portion on the front surface side is provided farther outward on the insulating substrate than an end of the back-side notched portion on the back surface side.

8. The semiconductor device according to claim 7, wherein
width of the front-side notched portion in the front surface is less than or equal to half of width of the back-side notched portion in the back surface.

9. The semiconductor device according to claim 1, further comprising:
a conductive pattern that is provided on the front surface of the insulating substrate, wherein
width of the front-side notched portion in the front surface is less than a distance between an end of the front-side notched portion on the front surface and the conductive pattern.

10. The semiconductor device according to claim 9, wherein
the width of the front-side notched portion in the front surface is less than or equal to 10% of the distance between the end of the front-side notched portion on the front surface and the conductive pattern.

11. The semiconductor device according to claim 1, wherein
a side wall of the recess portion opposite the side surface of the insulating substrate is inclined relative to the thickness direction toward the same side as the front-side notched portion.

12. The semiconductor device according to claim 11, wherein
the side wall of the recess portion is substantially parallel to the front-side notched portion.

13. The semiconductor device according to claim 1, wherein
the front-side notched portion is provided such that an end thereof on the front surface of the insulating substrate is farther inward in the insulating substrate than the peak, and
the back-side notched portion is provided such that an end thereof on the back surface of the insulating substrate is farther inward in the insulating substrate than the peak.

* * * * *